United States Patent
Donovan et al.

(10) Patent No.: US 6,850,177 B2
(45) Date of Patent: Feb. 1, 2005

(54) DIGITAL TO ANALOG CONVERTOR

(75) Inventors: Brian Donovan, Vancouver, WA (US); Ray S. McKaig, Vancouver, WA (US)

(73) Assignee: Xyron Corporation, Vancouver, WA (US)

(*) Notice: Subject to any disclaimer, the term of this patent is extended or adjusted under 35 U.S.C. 154(b) by 0 days.

(21) Appl. No.: 10/477,684

(22) PCT Filed: May 13, 2002

(86) PCT No.: PCT/US02/15191
§ 371 (c)(1),
(2), (4) Date: Apr. 12, 2004

(87) PCT Pub. No.: WO02/093752
PCT Pub. Date: Nov. 21, 2002

(65) Prior Publication Data
US 2004/0174286 A1 Sep. 9, 2004

Related U.S. Application Data
(60) Provisional application No. 60/290,919, filed on May 14, 2001.

(51) Int. Cl.[7] ............................................. H03M 1/82
(52) U.S. Cl. ...................................... 341/152; 341/144
(58) Field of Search .................................. 341/144, 152

(56) References Cited
U.S. PATENT DOCUMENTS 4,958,159 A * 9/1990 Wyatt .......................... 341/144
5,245,593 A * 9/1993 Yamate ........................ 341/144
5,457,457 A * 10/1995 Hayashi ...................... 341/144
6,594,308 B1 * 7/2003 Galbiati et al. ............. 375/238

* cited by examiner

Primary Examiner—Michael Tokar
Assistant Examiner—Khai Nguyen
(74) Attorney, Agent, or Firm—Chernoff, Vilhauer, McClung & Stenzel, LLP

(57) ABSTRACT

A method and circuit are provided for converting a digital signal to an analog signal in the form of a pulse width modulated (PWM) pulse (20). The PWM pulse is generated during an output cycle of a pulse generator to form a pulsetrain output of pulses at a fixed frequency whose widths are determined by dynamically changing digital input data. The method includes the steps of dividing the digital data signal into most significant bit (MSB) and least significant bit (LSB) portions. A PWM pulse is initiated at the beginning of an output cycle and continues while the MSB portion counts down in a counter (24). At the same time, the LSB portion of the digital data signal is converted to a precise phase delay signal which is a subcycle of an oscillator controlling the counter. This phase delay signal is generated after the termination of the MSB count, and halts the high period of the PWM pulse during the output cycle. When the output cycle ends, the process is repeated with the next digital signal.

5 Claims, 3 Drawing Sheets

DAC TIMING DIAGRAM

DIGITAL TO ANALOG CONVERTOR

This application is a 321 of PCT/US02/15191 filed on May 13, 2002 which claims benefit of the provisional application 60/290,919 filed on May 14, 2001.

BACKGROUND OF THE INVENTION

Digital to analog conversion circuits (DAC) with pulse-width modulated (PWM) outputs are common, but have not used subcycle precision timers to generate pulse width variations, and generally require extensive output filtering. As a result, output resolutions are limited to the highest frequency digital clock rates and counter speeds possible in a given technology. Where the technology permits high-speed docks, high power consumption and excessive heat generation result.

A commonly used method for generating PWM output is through the use of a standard DAC for analog generation. The resulting analog signal is then converted to PWM using analog modulation circuitry. This technique suffers from a lack of accuracy and controllability, and requires additional circuitry.

Delta-Sigma DAC circuits and over-sampling techniques use filtering to reduce undesired output noise. Delta-Sigma DACs use low-resolution high-speed DACs to create high-resolution lower speed outputs using interpolation techniques. By example, a 4 MHZ over-sampling rate might be used for 44 KHz audio. Sample values would be digitally interpolated prior to using a 1-bit DAC. The over-sampled pulse-position signal would be low-pass filtered, leaving only the desired output waveform. Such filtering processes take substantial amounts of time and require extensive additional circuitry. Phase distortion is introduced by these techniques, thus further deteriorating the quality of the output signals.

BRIEF SUMMARY OF THE INVENTION

A method and circuit are provided for converting a digital signal to an analog signal in the form of a pulse width modulated (PWM) pulse. The PWM pulse is generated during an output cycle of a pulse generator to form a pulsetrain output of pulses at a fixed frequency whose widths are determined by dynamically changing digital input data. The method includes the steps of dividing the digital data signal into most significant bit (MSB) and least significant bit (LSB) portions. A PWM pulse is initiated at the beginning of an output cycle and continues while the MSB portion counts down in a counter. At the same time, the LSB portion of the digital data signal is converted to a precise phase delay signal which is a subcycle of an oscillator controlling the counter. This phase delay signal is generated after the termination of the MSB count, and halts the high period of the PWM pulse during the output cycle. When the output cycle ends, the process is repeated with the next digital signal.

DETAILED DESCRIPTION OF THE PREFERRED EMBODIMENT

Figure 1:
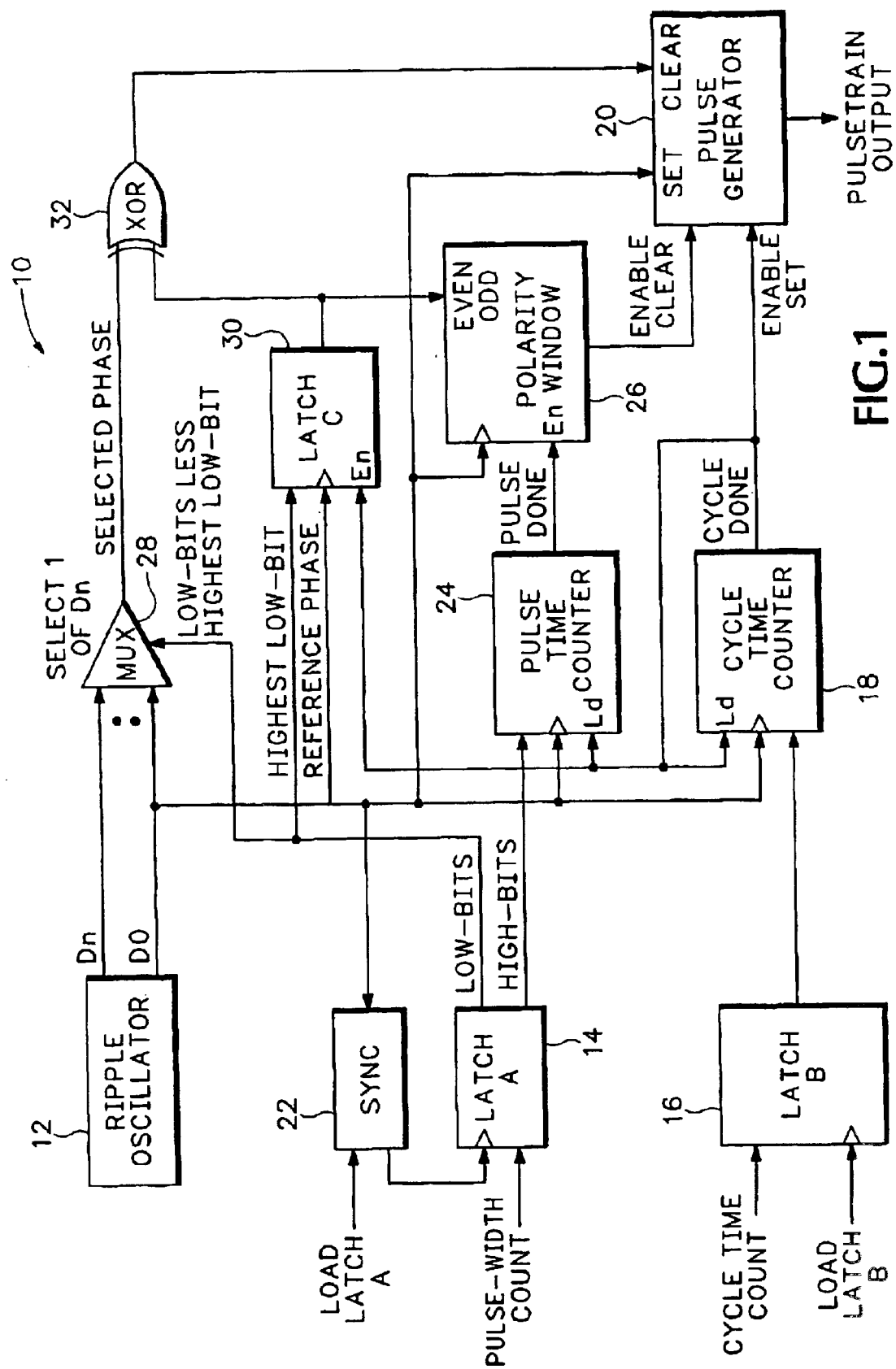
FIG. 1 is a block schematic diagram of the preferred embodiment of the invention, a high-speed DAC circuit utilizing PWM technology.

This invention is a high precision DAC circuit that converts digital data streams to varying pulse widths or analog outputs at high data rates. Digital data stream numbers representing digital pulse width times are converted to subcycle precision pulse width modulated signals. This is accomplished by utilizing a high-speed oscillator to generate a continuous square wave. The oscillator has taps for selecting multiple phases of the square wave, facilitating subcycle timing. Incoming digital numbers are split into two sections, the least significant portion (LSB) is used to select a subcycle phase and the most significant portion (MSB) is used for a counter. The size of the least significant portion is determined by the number of taps in the oscillator, while the remaining most significant value is used for counters. The longest portion of the pulse width is timed through the use of digital counters using the MSB portion of the split number. The smaller portion of the pulse width time is too short to determine using counters. This subcycle time is determined using the least significant section of the number to choose a phase from the tapped oscillator outputs through a selector. Each selected phase has a different time delay with respect to the rising edge of the oscillator's square wave output, increasing with each delay element in the oscillator. Larger selection numbers choose larger subcycle delay times. This subcycle signal in conjunction with the counter time is then used to control the width of an output pulse. As a result, the output PWM pulse widths have the timing precision of a single delay element, and have a dynamic range from extremely short subcycle intervals to extremely long multi-cycle intervals.

For analog output requirements, the PWM output signals can be time averaged. The resultant time averaged output analog voltage or current follows the magnitude of the digital input stream. Additional circuitry can output the PWM signals as true analog voltages or currents.

The major advantages of this circuit are that it provides much higher resolution PWM control with lower noise interference, and at lower power with less heat generation. Through inherent filtering by the resistive, capacitive, and inductive loading of external circuitry, the high-speed output rate of this invention reduces the need for output filters, often eliminating them entirely.

Digital Amplifiers can be implemented more effectively through the use of the circuit since the unfiltered PWM output of this invention can drive digital high frequency power output stages directly.

Headphones, amplifiers, and other analog devices can be driven directly from the digital PWM outputs due to the inherent low-pass filtering of the devices. Due to the circuit's high resolution and high-speed operation, this invention is sufficiently accurate to output commercial quality analog audio, video and radio signals. The invention's smaller and simpler circuitry results in markedly less phase distortion with more accurate reconstructions of the original digitized signals.

This invention is well suited for use in Delta-Sigma over-sampling circuitry for higher resolution conversions, yielding considerably higher resolutions than are achievable using existing technology. As in standard Delta-Sigma conversions, this is accomplished at the sacrifice of conversion time and is principally suited for low frequency operations.

Referring to FIG. 1, a high-speed digital to analog circuit (DAC) 10 includes a ripple oscillator 12, a latch A 14 and latch B 16. Latch B 16 is coupled to a cycle time counter 18. The "enable set" input of a pulse generator 20 is coupled to the output of cycle time counter 18. The pulse generator 20 is a PWM pulse generator whose "pulsetrain output" consists of pulses of varying width but having a fixed frequency. The width of each pulse in the "pulsetrain output" is determined by the numerical value of the digital input signals loaded into latch A. Latch A 14 is periodically loaded with binary data which changes the output pulse width durations within repeating sample cycle durations at the "pulsetrain output" of pulse generator 20.

Latch A 14 loads a pulse width count signal when it is clocked by a signal from synchronization circuit 22. Latch A 14 has two outputs. The high-bits output contains a signal representative of the most significant bits (MSB) of the input digital signal. The low-bits output contains the least significant bits (LSB) of the digital signal held within the latch. For illustration purposes, it will be assumed for this example that the "pulse width count" signal is a digital audio signal which is a 16-bit signal reoccurring at a 44 KHz rate. The "high-bits" output of latch A 14 is coupled to a pulse time counter 24. The output of the counter 24 is connected to the "enable" pin of a polarity window 26. In turn, the output of the polarity window 26 is coupled to the "enable clear" input of the pulse generator 20. The low-bits output of latch A 14 is connected to the selection input of a (MUX) 28. The MUX 28 contains inputs $D_0$ through $D_N$ which represent delays of differing phase of the pulses generated by the ripple oscillator 12. The output of the MUX 28 is a selected phase of the ripple oscillator selected in the MUX 28 by the low-bits line less the highest of the LSB number bits. The highest bit of the LSB output on the low-bits line is coupled to latch C 30. The output of latch C 30 is coupled to an input of XOR gate 32 along with the selected phase output of the MUX 28. This same output is also coupled as the "even odd" input of the polarity window circuit 26. The output of the XOR gate 32 is coupled to the pulse generator 20 on its "clear" input. Thus, the high portion of the PWM pulse of the pulse generator 20 is enabled at the beginning of an output cycle and continues until the end of the MSB portion at which time the "clear" function is enabled by the polarity window 26. The PWM pulse continues, however, until cleared by a signal from XOR gate 32 which represents the phase delay within ripple oscillator 12 caused by the LSB portion selection in MUX 28.

Figure 2:
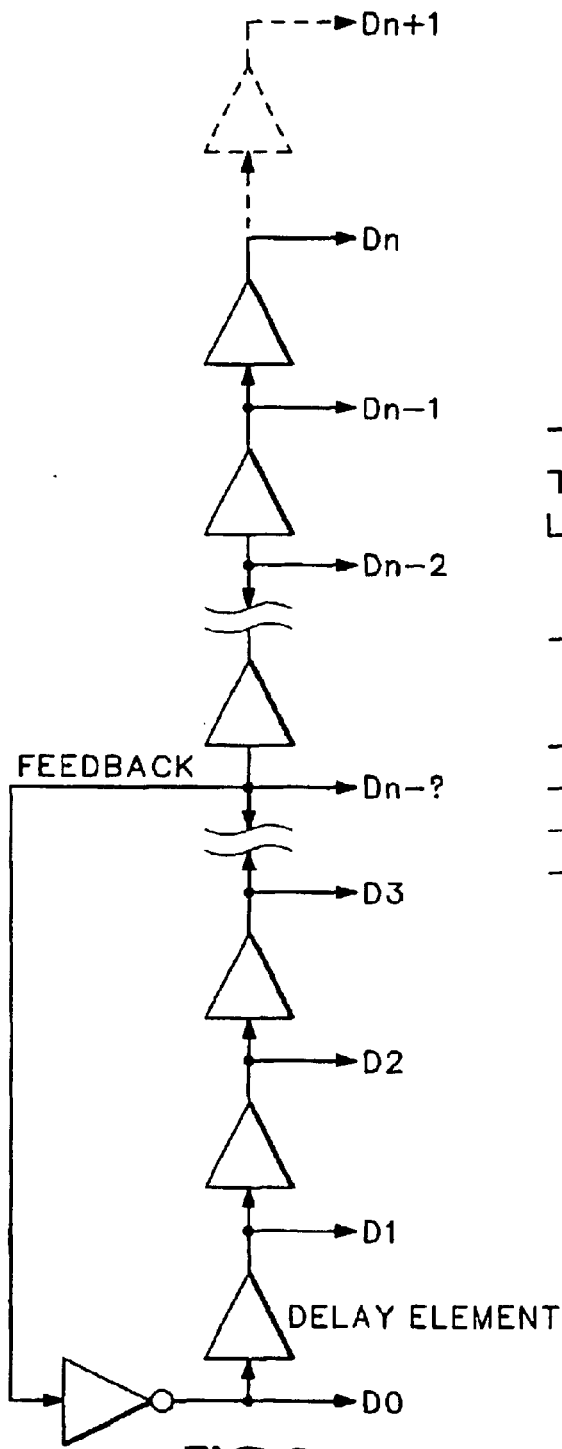
FIG. 2 is a block schematic diagram illustrating a high-speed ripple oscillator for high-resolution intervals which is used in the embodiment of FIG. 1.
Figure 2A:
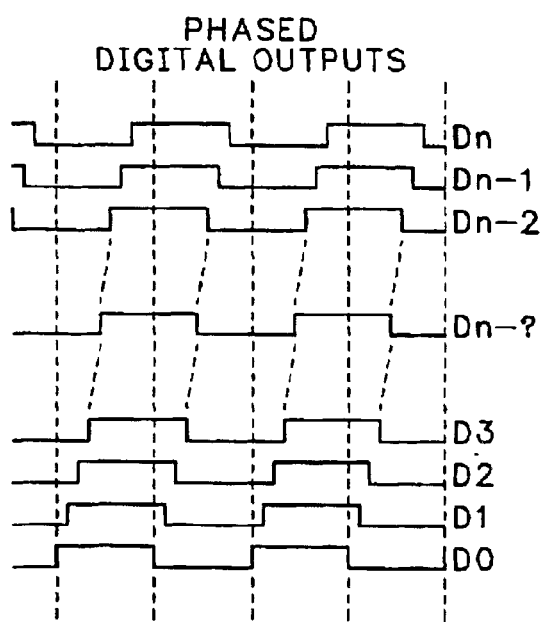
FIG. 2A is a wave form diagram of the subcycle phase delay pulses generated by the ripple oscillator of FIG. 2.

Referring to FIG. 1, one of the phase delay lines $D_0$ through $D_N$ of the ripple oscillator 12 is selected by the multiplexor 28 for the subcycle timing precision required to generate a pulse width modulated pulse that precisely matches the binary data which is periodically loaded into latch A 14. The width of this pulse varies within a constant overall pulse width cycle time which sets the duration for each output sample at the pulsetrain output of the pulse generator 20. Latch B 16 is loaded with a signal representing a constant overall pulse width cycle time. The ripple oscillator 12 generates a constant frequency square wave by feeding a negative signal back to its input $D_0$ from a point along a series of delay elements thus maintaining oscillation (refer to FIG. 2). Tap signals from each delay element are at different phase timings of this oscillator square wave with respect to the reference tap $D_0$ (refer to FIG. 3).

Referring again to FIG. 1, initialization of the circuit requires a one-time loading of latch B 16 to set a repeating cycle time. For the example chosen, this may be set for a repetition rate of 880 KHz. In order to maintain CD quality audio, latch A 14 must be loaded periodically with 16-bit data at a 44 KHz rate. Within the cycle time of latch B 16, the pulse generator 20 generates a pulse having a duration that is defined by the digital data value loaded into latch A 14. In the example chosen, twenty cycle times occur between each introduction of new data into latch A 14. Sample cycles begin when the cycle time counter counts down to zero, thus generating a "cycle done" pulse that enables a "reference phase" signal from the ripple oscillator 12 to load 16-bit data into the pulse time counter 24 and the cycle time count from latch B 16 into the cycle time counter 18. The "cycle done" pulse also enables the pulse generator 20 so that its output is set "high" at the beginning of the next cycle. During the cycle interval, the "reference phase" signal clocks down both pulse time counter 24 and cycle time counter 18. The pulse time counter 24 reaches zero first due to a smaller count value than that of the cycle time counter 18. When the pulse time counter 24 reaches zero, a "pulse done" signal is generated. This signal, which is coupled to the "enable" input of the polarity window circuit 26, allows the output of the pulse generator 20 to be set low on the rising edge of the output pulse from XOR gate 32 thus ending the "high" portion of the PWM. The remainder of the output cycle time continues to be counted by the cycle time counter 18 at which time the "cycle done" pulse begins a new sample cycle which is repeated generating the same PWM pulse until another value is stored in latch A 14 that changes the pulse width. Thus, the combination of the high-bit and low-bit portions of the 16-bit data periodically loaded into latch A 14 controls in an extremely precise way the variable width pulses generated by the pulse generator 20 within the sample cycle time interval as defined by the data in latch B 16 and the cycle time counter 18.

Figure 3:
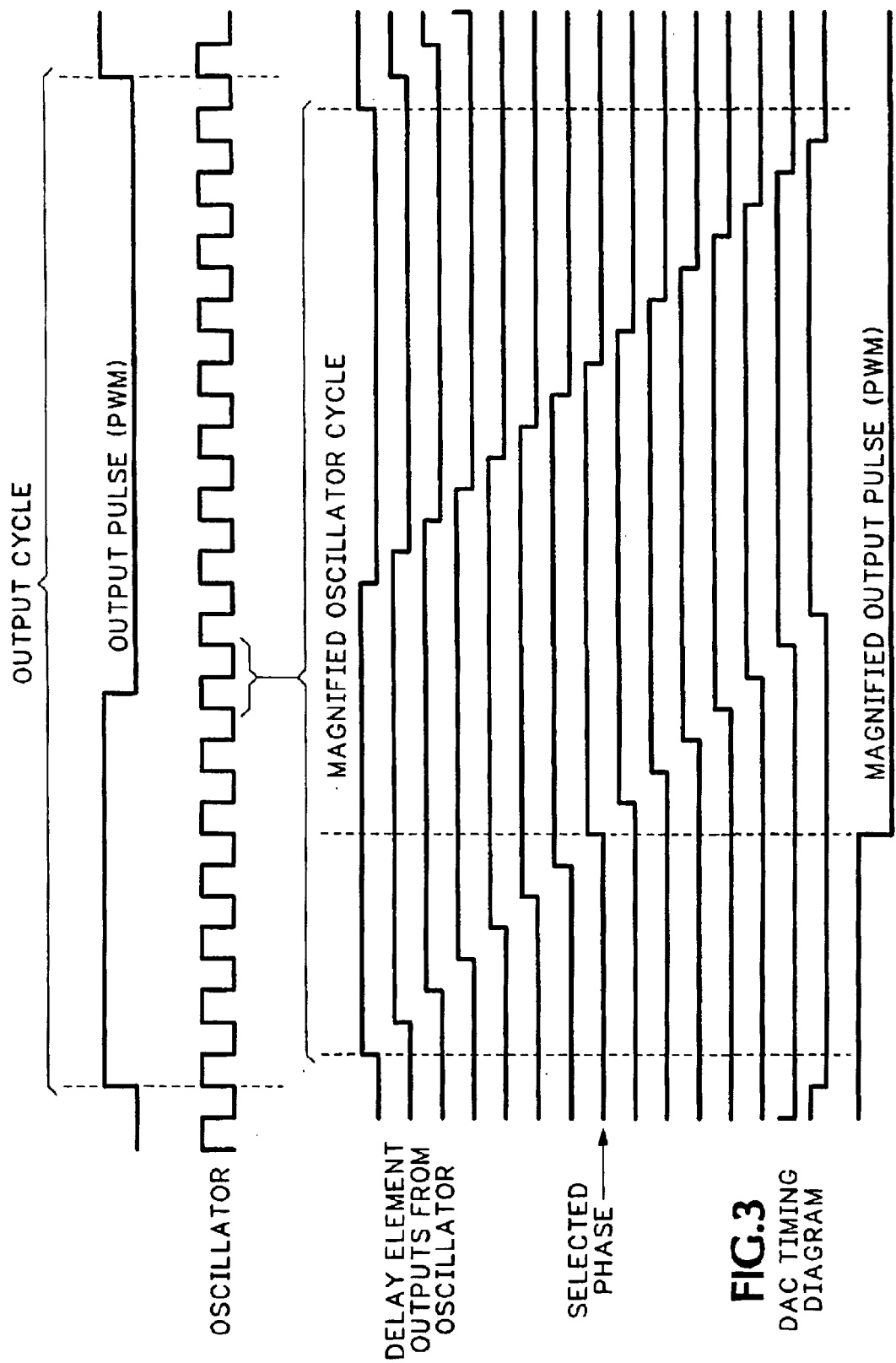
FIG. 3 is a wave form diagram showing the timing relationship between the output cycle period, the PWM pulse, and the subcycle phase delay pulses.

FIG. 3 illustrates the precision of the PWM output pulse provided by the pulse generator 20. By selecting a delay line $D_0$ through $D_N$ of the ripple oscillator output lines, a "subcycle" pulse is generated which represents a fraction of a complete cycle of the ripple oscillator 12. This is shown with reference to the "Magnified Oscillator Cycle Timing Diagram" of FIG. 3. It can be seen in the selected case that the selected phase delay has, in effect, phase shifted the output of the oscillator from the dashed line on the left side of the diagram to the dashed line toward the center of the diagram which amounts to a fraction of a complete oscillator cycle. By selecting one of the phase delayed lines $D_0$ through $D_N$, the oscillator's output is broken down into subcycles which may be selected to precisely control the timing of the PWM output at generator 20 by a value representing the least significant bits of the data loaded in latch A 14.

Because the oscillator cycle can be either high or low when the phase selection is made, circuitry is required to choose the polarity of the selected phase and provide a rising edge at the precise time required to end the pulse "high" time in the pulse generator 20. The ripple oscillator 12 has delay elements that cycle, high then low, to generate a full square wave. The oscillator has a rising edge at each of the delay elements only during the first half of the square wave. Since all of the delay elements output falling edges during the second half of the oscillator square wave cycle, inversion of the selected phase changes these phases to rising edges. The XOR gate 32 provides a means for selectively inverting the signal. The "highest low bit" binary signal is the next higher bit above the phase selection number and is used to cause signal inversion in the XOR gate 32 for timing selections mode during the second half of the square wave. Latch C 30 insures that the highest low bit inversion control is only changed at the beginning of a new cycle to prevent data changes in latch A 14 from affecting the XOR gate 32 at an inappropriate time. Since latch A 14 is loaded asynchronously with respect to the oscillator's "reference phase" signal, synchronizing circuitry in sync circuit 22 for loading latch A 14 is necessary to prevent metastable conditions when the pulse time counter 24 is loaded. Since latch B 16 is loaded only once, synchronizing circuitry is unnecessary as any metastable condition that could exist is corrected on the next loading of the cycle time counter 18.

Additional and Alternative Embodiments

To achieve even higher resolution and reduced noise, this invention may replace DAC circuits within present Delta-Sigma DAC technology. When incorporated into Delta-Sigma DAC circuits, this invention produces n times less high frequency noise power compared to the current Delta-Sigma interpolating DACs, where n is the timer resolution of the Pulse width time interval measuring circuit divided by the Delta-Sigma Converter's over-sampling time period. To illustrate this point, a 1 MHZ Delta-Sigma Converter might over-sample audio by 20 times the audio sampling rate. A typical Delta-Sigma quantizer uses a 1-bit clocked DAC, adding large amounts of high frequency noise power to the incoming digitized analog signal. A state-of-the-art Delta Sigma Converter using a 1 bit DAC operating at 1 MHZ thus has a one microsecond pulse edge placement inaccuracy. The resultant high frequency noise must be filtered out for an acceptable output. Typically, this is accomplished by using a 101-tap digital interpolative FIR filter and an analog low pass filter at the cost of additional long-latency, extensive circuitry. When incorporated into an existing Delta-Sigma circuit, this invention would produce only $1/50,000^{th}$ of the corresponding Delta-Sigma's noise power when using 20-picosecond resolution sub cycle delay taps, and less noise would result from even smaller resolution intervals. Thus, this invention's noise factor is so low that little if any digital filtering is needed. The magnitude of the output analog high frequency noise is also lower and is mostly at a single frequency which simplifies the analog output filter requirements.

Various delay element tuning methods may be employed for high accuracy applications. Laser trimming, floating gate settable resisters, voltage variable capacitors, and other methods may be used to adjust individual delay elements for improved linearity. These controlled delay techniques can also be combined with analog delay techniques, such as digitally controlled analog delay cells.

Delay elements may be synchronized or calibrated to a reference clock, improving the timing repeatability of the DAC oscillator. Delay elements may be "current starved" to slow them down as needed. Delay lines may be tuned for synchronization by methods such as varying intrinsic capacitance using voltage-controlled capacitors, or by changing inductance by the use of transformers with DC bias control.

Very precise timing resolutions are achievable by the use of fast delay technologies, such as wire delay lines and resonant cavities. Timing resolutions approaching 100 femtoseconds and shorter can be achieved using such technologies.

The preferred embodiment's precision PWM provides resolutions adequate for most applications. Greater dynamic ranges may be achieved by separately controlling the power source for the PWM output stage, thereby changing the output voltages or currents in conjunction with pulse width variations. A second DAC or other control circuit may be used to control voltage levels on the final output stage of the PWM. Floating point numbers may be used for digitally represented analog data. For example, a 32-bit floating-point number might use a 24-bit mantissa to directly control the DAC invention described above, while the 8 bit exponent can control the output levels exponentially. These methods result in outputs that are controllable in billions of steps. Additionally, this invention is not limited to linear time delays, opening the potential for logarithmic or other numerical progressions.

A multitude of output circuit configurations are possible for different applications, some stated here:

1. Transistor pull-up or pull-down only
2. Totem-pole pull-up and pull-down
3. Tri-voltage output with mid-voltage off state
4. Tri-state pull-up and pull-down with off condition
5. Full bridge bi-directional drive with dual outputs
6. True analog with sample-hold outputs
7. True analog with sample-hold complimentary dual outputs.

External power transistors may be driven directly from the PWM outputs. Feedback from final output stages may be used to adjust the invention's output signals for optimum performance.

An alternate configuration for this invention is a high-precision short-interval programmable delay timer. In this version, a memory array is given a list of numbers of sequential delays. After each pulse delay, the output signal is alternately set or reset, the memory pointer is incremented to point to the next data, and the oscillator is cleared to begin another precision timing cycle. When the last memory entry has been reached, the memory pointer is reset to point to the beginning of the list, and for once-only applications the oscillator is stopped. This configuration generates precision-width single and repetitive complex pulse sequences, and continuous clock outputs with stable precision pulse widths. This aspect of the invention facilitates high-accuracy variable duty cycle clock signal generation with precise frequency control.

It should be understood from the foregoing that this invention contemplates that alternative implementations of its pulse generating circuitry can be used to selectively center the pulse widths around any reference location within the pulse repetition timing count to reduce harmonic distortion.

While various embodiments of the present invention have been described above, it should be understood that they have been presented by way of example, and not limitation. Thus, the breadth and scope of the present invention should not be limited by any of the above-described exemplary embodiments, but should be defined only in accordance with the following claims and their equivalents. It will be understood by those skilled in the art that various changes in form and detail may be made therein without departing from the spirit and scope of the invention.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A method for converting a digital signal to an analog signal wherein said analog signal is in the form of a pulse width modulated (PWM) pulse having an output cycle, comprising the steps of:

a) dividing said digital signal into most significant bit (MSB) and least significant bit (LSB) portions;

b) initiating a PWM pulse at the beginning of said MSB portion during said output cycle;

c) converting said LSB portion to a subcycle phase delay signal; and d) terminating said PWM pulse with said subcycle phase delay signal during said output cycle and after the conclusion of said MSB portion.

2. The method of claim 1 wherein step (c) is performed by shifting a phase of an oscillator by an amount less than a complete cycle of said oscillator.

3. A digital to analog convertor (DAC) circuit comprising:

a) an input network for receiving a digital data signal and for dividing said digital data signal into a most significant bit (MSB) portion and a least significant bit (LSB) portion;

b) a pulse width modulator (PWM) circuit for generating pulses of varying length within a fixed output cycle;

c) a pulse counter network for enabling said PWM circuit to begin generating a PWM pulse at the beginning of said MSB portion of said digital pulse signal;

d) a phase delay network responsive to said LSB portion for generating a subcycle pulse; and e) logic means coupling said subcycle pulse to said PWM circuit after the termination of said MSB portion to determine the width of said PWM pulse generated by said PWM circuit.

4. The DAC circuit of claim 3 wherein said phase delay network comprises a ripple oscillator coupled to a multiplexor said multiplexor having an LSB input for selecting a delay phase of said ripple oscillator in response to the value of said LSB portion.

5. The DAC circuit of claim 4 wherein said logic means comprises polarity selection means for correcting the polarity of a selected phase of said ripple oscillator.

* * * * *